United States Patent [19]

Rinerson et al.

[11] Patent Number: 4,615,020
[45] Date of Patent: Sep. 30, 1986

[54] NONVOLATILE DYNAMIC RAM CIRCUIT

[75] Inventors: Darrell D. Rinerson, Santa Cruz; Patrick T. Chuang, Cupertino, both of Calif.

[73] Assignee: Advanced Micro Devices, Inc., Sunnyvale, Calif.

[21] Appl. No.: 558,647

[22] Filed: Dec. 6, 1983

[51] Int. Cl.[4] .............................................. G11C 11/40
[52] U.S. Cl. ..................................... 365/184; 365/185; 365/228; 357/23.5
[58] Field of Search ............... 365/149, 184, 185, 228; 357/23.5, 23.6

[56] References Cited

U.S. PATENT DOCUMENTS

| | | | |
|---|---|---|---|
| 3,744,036 | 7/1973 | Bentchkowsky | 365/185 |
| 3,836,992 | 9/1974 | Abbas et al. | 365/185 |
| 3,916,390 | 10/1975 | Chang et al. | 357/23.5 |
| 4,094,008 | 6/1978 | Lockwood et al. | 365/149 |
| 4,119,995 | 10/1978 | Simko | 357/23.5 |
| 4,175,291 | 11/1979 | Spence | 365/184 |
| 4,247,918 | 1/1981 | Iwahashi et al. | 357/23.5 |
| 4,375,086 | 2/1983 | Van Velthoven | 365/149 |
| 4,397,003 | 8/1983 | Wilson et al. | 365/208 |

Primary Examiner—Terrell W. Fears
Attorney, Agent, or Firm—Patrick T. King; Eugene H. Valet; Davis Chen

[57] ABSTRACT

A nonvolatile dynamic RAM capable of operating in a dynamic RAM mode and a second, nonvolatile mode, is disclosed. The nonvolatile dynamic RAM has a memory cell having a transfer transistor for coupling a storage capacitor having a floating gate to a bit line. The memory cell holds information by the storage of charge in the storage capacitor and also holds information by the storage of charge in the floating gate. This data can be stored and retrieved in a volatile mode and in a nonvolatile mode. The nonvolatile dynamic RAM has a plurality of these memory cells connected to a bit line which, in turn, is connected to a sense amplifier for determining the presence or absence of storage charges in the storage capacitor of a selected memory cell in the first mode, and for determining the presence or absence of storage charges in the floating gate of the selected memory cell in the second mode.

17 Claims, 6 Drawing Figures

NONVOLATILE DYNAMIC RAM CIRCUIT

FIELD OF THE INVENTION

This invention relates to electronic memory circuits, and more particularly, to a nonvolatile memory circuit capable of operating in a dynamic RAM mode and a second, nonvolatile mode.

BACKGROUND OF THE INVENTION

One of the disadvantages of semiconductor RAMs (random access memories) is that they are volatile. These memory devices retain their information as long as power is supplied to them. However, as soon as power is lost, the stored information is also lost.

Different types of ROMs (read only memories) are used for information which is required to be stored in a nonvolatile memory. Recently EPROMs (erasable programmable read only memories) and EEPROMs (electrically erasable programmable read only memories) have become widely available. In an EPROM the user may program the device electrically and erase the entire device by exposing it to ultraviolet light. In an EEPROM the device is programmable and erasable electrically.

While these devices have the desired feature of nonvolatility, they are somewhat more inconvenient to use than a RAM. The EPROM and EEPROM require higher voltages to program (or WRITE) the device than the operating semiconductor RAMs. Furthermore, high voltages are required to erase information from the EEPROM. The EPROM requires removal of the device from the system for exposure to ultraviolet light. Thus these nonvolatile devices do not have the ease by which a RAM can store and change the stored information. Thus, many electronic memory systems have an organization in which RAMs store transient information, such as process data, and some kind of ROM to retain information which would be inconvenient to lose in case of a power outage. Such information might be the program to process the data. In any case, two sets of semiconductor devices are required.

The present invention provides for a semiconductor device which has the advantages of a RAM and an EEPROM. In one mode data can be stored and retrieved easily. In a second mode data can be stored in a nonvolatile state so that the danger of power outages is eliminated. These features are combined in one device so that the purchase of two different types of memory devices is eliminated.

SUMMARY OF THE INVENTION

To achieve these advantages, the present invention has a novel memory cell. The memory cell comprises a storage capacitor having a floating gate capable of storing charge to vary the capacitance of the storage capacitor whereby the memory cell holds information by the storage of charge in the storage capacitor and also information by the storage of charge in the floating gate. The memory cell also has a transfer device connected between the storage capacitor and an input/output line. The transfer device is responsive to a control signal so that information may be transferred between the input/output and the storage capacitor.

In a semiconductor substrate, the storage capacitor of the memory cell comprises first and second regions in the substrate, a floating gate layer over the substrate and between the first and second regions, and a plate layer over the first and second regions and the floating gate. The transfer device of the memory cell comprises third and fourth regions in the semiconductor substrate, and a transfer gate layer over the substrate and between the third and fourth regions.

Another aspect of the memory cell of the present invention comprises a transistor having a first terminal coupled to an input/output line, a second terminal, and a control terminal for coupling the first terminal to the second terminal responsive to control signals, a first storage capacitor coupled to the second terminal, a second storage capacitor, and a transistor, having a floating gate, coupled between the first and second storage capacitors in such a manner that the second storage capacitor is coupled to the first storage capacitor depending upon the presence or absence of charge on the floating gate.

Furthermore, the present invention provides for a memory circuit capable of information storage in two modes comprising a plurality of memory cells, each cell having a storage capacitor with a floating gate for storing charge to vary the capacitance of the storage capacitor and a transistor for selectively coupling the storage capacitor to a sense line responsive to a selection signal, and a sense amplifier connected to the sense line for determining the presence or absence of stored charges in the storage capacitor in a first mode, and for determining the presence or absence of stored charges in the floating gate in a second mode.

BRIEF DESCRIPTION OF THE DRAWINGS

A detailed understanding of the present invention may be achieved by a perusal of the following Detailed Description of Specific Embodiments of the Invention with reference to the following drawings:

FIG. 2 A is a schematic drawing of the memory cell shown in FIG. 1.

DETAILED DESCRIPTION OF PREFERRED EMBODIMENTS OF THE INVENTION

Figure 1:
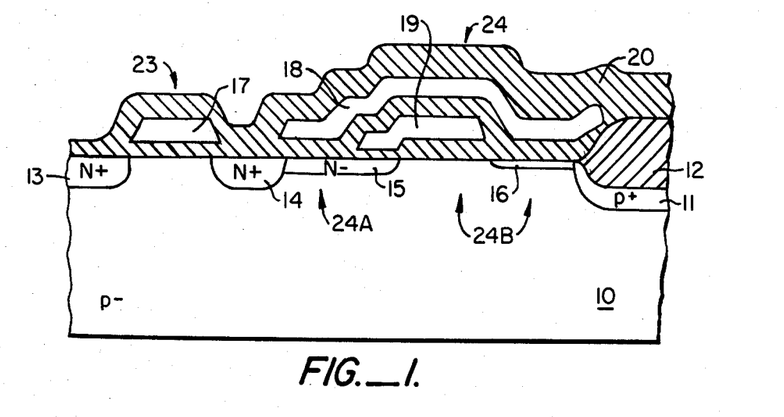
FIG. 1 is a cross-sectional view of the memory cell of the present invention.
Figure 2A:
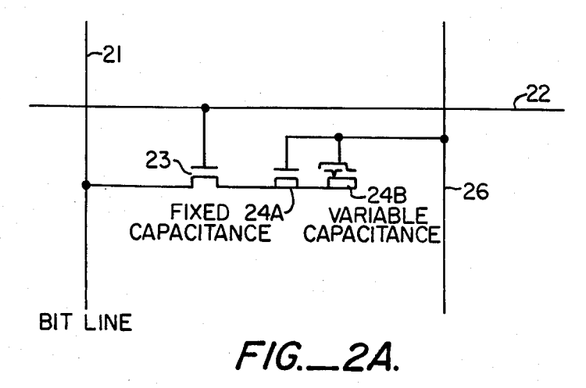

A memory cell of the present invention is shown in FIG. 1. The memory cell is manufactured in accordance with present day MOS semiconductor technology in a lightly P-doped semiconductor substrate 10, typically silicon. The memory cell is formed by an access transistor 23 and a storage capacitor 24 having a variable capacitance. The storage capacitor has a fixed capacitance structure 24A and a variable capacitance structure 24B as indicated in FIG. 2A.

The access transistor 23 is formed by two heavily doped N+ regions 13, 14 in the substrate 10. Together with a conducting layer 17, the N+ regions 13, 14 form an MOS transistor. The conducting layer 17 is the gate of the transistor, while the regions 13, 14 form the source and drain regions. A positive voltage signal on the gate 17 permits the surface region of the substrate 10 below the gate 17 to become conducting so that signals can pass between the regions 13, 14. The region 13 is also part of an input/output line, commonly called the bit line in semiconductor device terminology.

The storage capacitor 24 has a conducting layer 18, which forms a capacitor plate of the storage capacitor. Lightly doped N− regions 15, 16 form the capacitor elements opposite the capacitor plate layer 18. Between the regions 15, 16 and above the substrate 10 is a floating gate layer 19 which is electrically isolated from the regions 15, 16 and the capacitor plate layer 18.

The floating gate layer 19 has a double level construction so that the floating gate layer 19 is much closer to the substrate 10 above the region 15 than above other regions of the substrate 10. This proximity to the region 15 permits electrons to travel from the region 15 to the floating gate 19 and in the opposite direction despite the existence of an insulating layer 20 between the region 15 and layer 19. The conditions under which electrons travel or "tunnel" between the region 15 and layer 19 are discussed below.

The memory cells are electrically isolated from each other by well known field oxidation techniques, which result in a thick field oxide layer 12 and a field implant layer 11 below. The field implant layer 11 is doped with P-type impurities to prevent undesired leakage currents between neighboring memory cells.

The surface of the substrate 10 is covered by an insulating layer 20 of silicon dioxide. The layer 20 also separates the floating gate 19 from the capacitor plate 18. Though the layer 20 is shown as unitary, in actual practice it is formed by a series of insulating layers by semiconductor manufacturing techniques well known to practitioners in the field. The layers 17, 18, and 19 are formed out of doped polycrystalline silicon. In this embodiment the layer 19 is deposited and defined before the layers 17, 18 are formed.

The memory cell has two distinct capacitance states which are determined by whether or not excess electrons are stored in the floating gate 19. When the floating gate 19 contains excess electrons, it isolates the surface doped region 16 from the doped region 15 as long as the capacitor plate layer 18 stays at zero volts. The existence of the excess electrons then cuts off the capacitance 24B on the right side of the storage capacitor from the capacitance 24A on the left side, which communicates with the bit line 13 as shown in FIG. 1. With only the left hand capacitance 24A available, the memory cell capacitance is low. On the other hand, if the floating gate 19 does not contain excess electrons, the two capacitances are combined so that the memory cell capacitance is high.

These two capacitance states are given by the following two equations:

$$C_{LOW} = C_1 + C_2 + C_3 + \frac{C_4 C_5}{C_4 + C_5}$$

$$C_{HIGH} = C_1 + C_2 + C_3 + C_6 + \frac{C_5(C_4 + C_7)}{C_5 + C_4 + C_7} + C_8 + C_9$$

where $C_1$ is the capacitance between the region 14 and the substrate 10, $C_2$ is the capacitance between the region 15 and the substrate 10, $C_3$ is the capacitance between the capacitor plate layer 18 and the region 15, $C_4$ is the capacitance between the floating gate layer 19 and the region 15, $C_5$ is the capacitance between the capacitor plate layer 18 and the floating gate layer 19, $C_6$ is the capacitance between the undoped surface region between the doped regions 15, 16 and the bulk semiconductor substrate 10, $C_7$ is the capacitance between the floating gate layer 19 and the undoped substrate surface region between the doped regions 15, 16, $C_8$ is the capacitance between the capacitor plate layer 18 and the doped region 16, and $C_9$ is the capacitance between the doped region 16 and the bulk semiconductor substrate 10.

Two other capacitance quantities must also be considered. The first is the capacitive coupling from the capacitor plate layer 18 to the floating gate layer 19, which is given by the equation:

$$C_{CP-FG} = \frac{C_5}{C_4 + C_5 + C_7}$$

This coupling, indicative of the capacitance between the capacitor plate layer 18 to the floating gate layer 19 with respect to the capacitance of the floating gate layer 19 to the substrate surface, should be as large as possible. This allows the voltage on the floating gate layer 19 to closely follow the voltage on the capacitor layer 18 and aids in the charging and discharging of electrons of the floating gate layer 19.

The coupling between the capacitor plate layer 18 and the internal storage node is also important. This coupling, indicative of the capacitance of the capacitor plate-floating gate structure to the substrate surface regions with respect to the capacitance of the surface substrate regions to the bulk substrate, is:

$$C_{CP-SN} = \frac{C_3 + \frac{C_5(C_4 + C_7)}{C_5 + C_4 + C_7} + C_8}{C_3 + \frac{C_5(C_4 + C_7)}{C_5 + C_4 + C_7} + C_8 + C_1 + C_2 + C_6 + C_9}$$

Since the memory cell of the present invention is part of an integrated circuit, this capacitive coupling should also be as large as possible. For the charging or discharging operation of the floating gate of a selected memory cell, the capacitor plate layer 18 is held at a first voltage and the doped substrate region 15 at a second voltage to create a large voltage difference (20 volts) for electron tunnelling. Other memory cells, which are not selected but are coupled to the selected memory cell, have their capacitor plate layers 18 set at the first voltage, while the voltages of their doped substrate regions 15 are allowed to float. The large capacitive coupling permits the voltages of the floating regions or layers to follow the voltages of the set layers or regions. No large differences in voltage occurs and therefore no electrons tunnel. Charging and discharging of a floating gate only occurs for the selected memory cell.

The memory cell of the present invention is designed to yield approximately the following values:

$C_{LOW} = 0.04$ picofarads
$C_{HIGH} = 0.08$ picofarads $C_{CP-FG} = 0.05$ $C_{CP-SN} = 0.75$.

Schematically the memory cell appears as shown in FIG. 2A. The storage capacitor 24 is formed by two capacitors, a capacitor 24 having a fixed capacitance 24A and a capacitor 24B which combines additively to the capacitor 24A, depending upon whether the floating gate 19 is charged by excess electrons or not. The storage capacitor 24 is coupled to a bit line 21 by the access, or transfer, transistor 23. When a signal is present on a line 22 which controls the gate of the transistor 23, the storage capacitor 24 is coupled to the bit line 21. The capacitor plate of the storage capacitor is connected to a third line 26.

Figure 2B:
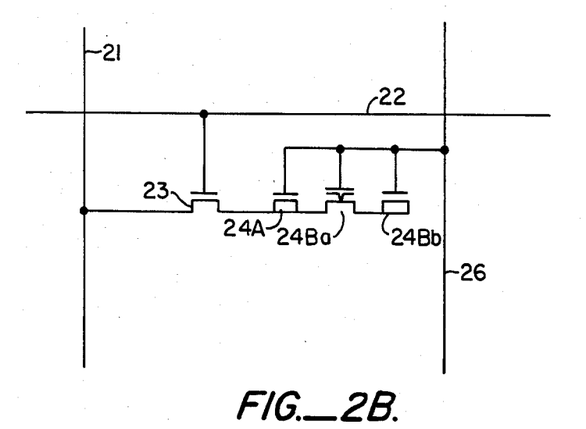
FIG. 2B is a schematic diagram of a memory cell modified from that of FIG. 1.

FIG. 2B is a different schematic diagram of the present memory cell. The variable capacitance structure 24B of FIG. 2A is shown separated into a floating gate transistor 24Ba and a capacitor 24Bb. This more clearly shows how the charging of the floating gate layer 19 isolates the capacitor 24Bb from the fixed capacitor 24A. When excess electrons are not present on the floating gate of the transistor 24Ba, the combination of the capacitors 24A, 24Bb increase the memory cell capacitance to $C_{HIGH}$. The capacitance of the capacitor 24A alone is $C_{LOW}$.

To turn the access transistor 23 on, the voltage of nearly +5 volts is required. Higher voltages are required to charge the floating gate of the memory cell and to erase these charges. To charge the floating gate the bit line 21 is held at zero volts while the word line 22 and the capacitor plate line 26 are raised to +20 volts. This causes a large voltage difference between the capacitor plate layer 18 and the doped regions 14, 15 and the substrate 10. Electrons through the tunnelling phenomenons jump to the floating gate layer 19.

To erase the electrons from the floating gate, the bit line 21 is raised to 20 volts, along with the word line 22. The capacitor plate line 26 is kept at zero volts.

Figure 3:
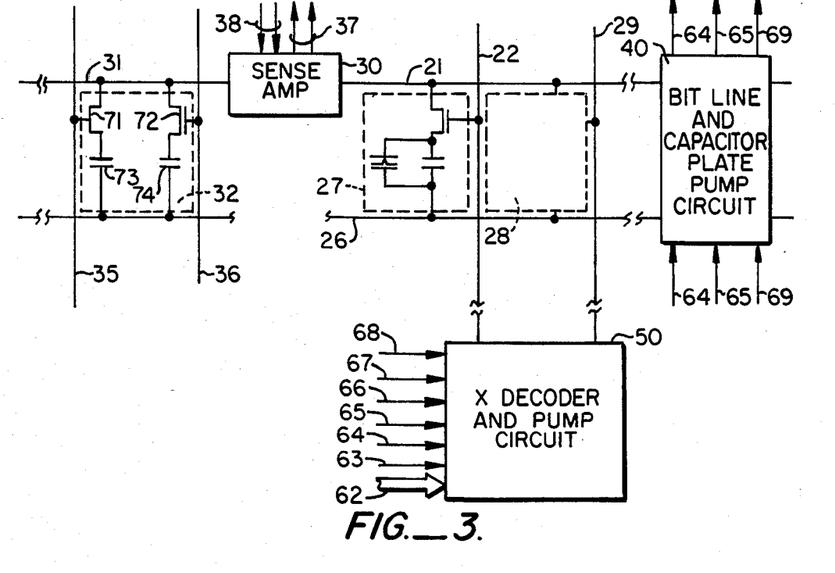
FIG. 3 illustrates a memory circuit which uses the memory cell of the present invention.

FIG. 3 illustrates a memory circuit which utilizes the novel memory cell. The memory circuit is part of a nonvolatile dynamic RAM, which operates as an ordinary dynamic RAM in one mode and as a nonvolatile memory storage device in another mode. For purposes of understanding the invention, the same reference numerals are used in the drawings where possible.

In FIG. 3 a plurality of memory cells is connected to the bit line 21 and the capacitor plate line 26. The plurality of memory cells is represented by two cells 27, 28. Each memory cell 27, 28 is also connected to a word line 22, 29 upon which control signals permit access of the storage capacitor with the bit line 21. The word line 22 controls the access transistor of the memory cell 27 and the word line 29 performs the same function for the memory cell 28. The bit line 21 is connected to a sense amplifier 30, which is also connected to a second bit line 31.

A reference memory cell 32 having a pair of reference capacitors 73, 74 is connected to the bit line 31. A pair of gate transistors 71, 72 couple the capacitors 73, 74 to the bit line 31 responsive to signals on a pair of reference capacitor selection control lines 35, 36, respectively. The sense amplifier 30 comprises a flip-flop circuit having a pair of input/output terminals connected to the bit line 21 and the bit line 31.

The bit line 21 and the capacitor plate line 26 are further connected to a pump circuit 40. The bit line 21 normally operates between 0 and 5 volts and the pump circuit 40 is used to raise the voltage of the bit line 21 and capacitor plate line 26 to 20 volts selectively so that electrons can be stored and erased from the floating gate of a selected memory cell. Lines 64, 65, and 69 are control lines for the pump circuit 40 to perform its function.

The memory cells connected to the bit line 21 are selected by control signals on the word lines 22, 29 by an X decoder and pump circuit 50. The circuit 50 sends control signals on the word lines 22, 29 in response to address signals on address lines 62 and control lines 63. The circuit 50 can also raise the word lines 22, 29 to 20 volts responsive to signals on the lines 63–68.

Each memory cell has a capacitance of approximately 0.04 picofarads when the floating gate of the cell is charged. The capacitance of the memory cell is doubled to approximately 0.08 picofarads, $C_{HIGH}$, when the floating gate is not charged. Based upon these capacitance values, the reference memory cell capacitor 74, which is used for volatile data, has a value of approximately one-half $C_{LOW}$. The reference cell capacitor 73, which is used for nonvolatile data, has a capacitance about midway between $C_{LOW}$ and $C_{HIGH}$.

The nonvolatile dynamic RAM of the present invention has an operating mode like that of a dynamic RAM. A dynamic RAM READ operation is performed to obtain volatile information stored in the memory cells. A dynamic RAM WRITE operation transfers information into the memory cells for volatile storage. Finally, a REFRESH operation periodically revitalizes the volatile information in the memory cells.

A second operating mode is for the retrieval from and placement of information into the memory cells for nonvolatile storage. A RECALL operation obtains the nonvolatile information in the memory cells. To place information into the memory cells for nonvolatile storage, a STORE operation is used.

It should be noted in the discussion of dynamic RAM operation, the operational terms, "charge" and "discharge" of the bit lines appear to be reversed compared to conventional dynamic RAM terminology. The discussion here refers to electron movement, while conventional dynamic RAM terminology refers to the movement of positive charges. Thus, the dynamic RAM operation of the present invention is the same as a conventional dynamic RAM. The selection of electron movement in the dynamic RAM operation of the invention here is for a consistent explanation with the operation of the nonvolatile operation, which is based upon electron tunnelling.

To perform a dynamic RAM READ operation, the bit lines 21, 31 are first discharged to approximately +5 volts, the so-called bit line precharge operation. Then a memory cell is selected by a control signal on the word lines 22, 29 to couple the selected memory cell to the bit line 21. Simultaneously the bit line 31 is coupled to a reference memory cell 32.

If a charge corresponding to zero voltage, identified as the logic "0" state, had been stored in the selected memory cell, a charge redistribution occurs between the bit line 21 and the selected memory cell when the cell is coupled to the bit line 21. The bit line 21 voltage decreases by an amount proportional to the bit line precharge multiplied by the ratio of the cell capacitance to the bit line capacitance. On the other hand, if a charge corresponding to a high voltage, approximately +5 volts, had been stored in the selected memory cell, little charge redistribution occurs. The bit line voltage decreases little, if at all, for this logic "1" state in the selected memory cell.

On the other side of the sense amplifier 30, the reference cell has not been discharged. The reference capacitor 74 is selected by a control signal on the selection control line 36. For proper operation the capacitance of the capacitor 74 is determined such that the capacitance of the bit line 31 and capacitor 74 is intermediate the capacitance of the bit line 21 and lowest capacitance of a memory cell, and the capacitance of the bit line 21 alone. With the capacitance of the bit line 31 the same as the bit line 21, a value for the capacitance of the reference capacitor 74 of one-half of $C_{LOW}$ is believed to be optimum. Thus, the voltage on the bit line 31 is decreased by one-half of that on the bit line 21 when a logic "0" is stored in the selected memory cell.

The two bit lines 21, 31 and their coupled memory cells are then charged (or discharged, in conventional RAM terminology) through the sense amplifier 30. The charge race between the two bit lines 21, 31 will result in the sense amplifier 30 being sent in one of two alternate logic states. The voltage difference which initially appears between the two bit lines 21, 31 is magnified by the charge race and is sensed by the amplifier 30, which latches into one logic state or the other. A "pull up" circuit (not shown) raises the bit line with the higher voltage to +5 volts, and lowers the bit line with the lower voltage to zero volts. Pull up circuits are commonly used in large (64K) dynamic RAMs to clearly maintain the voltage of one digital state from the voltage of the other state.

The sense amplifier 30 communicates the latched state to the rest of the integrated circuit through a pair of lines 37. Thus the logic state stored in the memory state can be determined. Regardless of whether the floating gate of a selected memory cell is charged or not, volatile logic information may be stored in and retrieved from the memory cells.

Information is placed onto the memory cells for volatile storage by a WRITE operation. A logic "1" is stored in a memory cell by raising the bit line 21 to +5 volts and turning on one of the word lines 22, 29 to turn on the respective access transistor of the selected memory cell. For the storage of a "0" logic state in a memory cell, no electrons are removed from the selected memory cell. The bit line 21 is left at ground, zero volts.

Dynamic RAMS, including that of the present invention, require a periodic REFRESH operation to ensure that the electrons removed from the memory cells have not leaked back. The REFRESH operation is sequentially performed like a READ operation for each one of the memory cells and the pull up circuits described previously restore the voltage of the selected memory cell to a +5 volts or 0 volts, as required. Naturally the REFRESH operation on each memory cell has a cycle time smaller than the time for a charge discharged from a memory cell to leak back to such an extent that the logic state in the memory cell becomes difficult to determine.

In contrast, charges stored in the floating gate of a memory cell do not leak away. The charges remain unless erased under the conditions described above.

For a RECALL (nonvolatile RAM READ) operation, the reference capacitor 73 of the reference cell 32 is used by turning the transistor 72 off and turning the transistor 71 on by a control signal on the control line 35. The reference capacitor 73 has a value of intermediate the capacitances of a memory cell having its floating gate charged and uncharged. In the nonvolatile mode each memory cell stores a bit of information depending upon whether the floating gate is charged or not, i.e., whether the memory cell has a capacitance of $C_{LOW}$ or $C_{HIGH}$. In this mode, $C_{LOW}$ represents a logic "1" state and $C_{HIGH}$ represents a logic "0" state.

As in the READ operation, both bit lines 21, 31 are precharged, i.e., electrons are removed, at the start of the RECALL operation. The reference capacitor 73 and the storage capacitor of the selected memory cell are then connected to their respective bit lines. If the floating gate of the selected memory cell is charged, then the memory cell has a capacitance of $C_{LOW}$ so that the voltage of the coupled bit line 21 and the memory cell is higher than the voltage of the bit line 31 and reference capacitor 73. The bit line 21 correspondingly stays at a higher voltage and the sense amplifier 30 latches correspondingly. On the other hand, if the selected memory cell has a capacitance of $C_{HIGH}$ (the floating gate is not charged), then the voltage on the bit line 31 remains higher than the bit line 21. The sense amplifier 30 and the volatile part of the selected memory cell correspondingly are set in that state.

In a STORE (non-volatile RAM WRITE) operation a dynamic RAM WRITE operation loads the information into a memory cell. Then a dynamic RAM READ operation is performed so that this information is latched into the sense amplifier 30. If a logic "1" is to be STOREd, the bit line 21 is therefore at 5 volts. The pump circuit 40 in FIG. 3 responsive to signals on the line 64, 65 and 69, raises the voltage to approximately +20 volts. Similarly the circuit 50 raises the voltage on one of the word lines 22, 29 of the selected memory cell to +20 volts also. The capacitor plate line 26 remains at zero volts. This operation ensures that the floating gate of the selected memory cell is discharged. The bit line 21 is then brought down to +5 volts and the STORE cycle ends.

If the value on the bit line 21 is a logic "0", or zero volts, the bit line 21 remains at zero volts during the STORE operation. The pump circuit 40 raises the capacitor plate line 26 to +20 volts, while the circuit 50 raises the word line of the selected memory cell to +20 volts. This combination of voltages upon the selected memory cell allows electrons to tunnel to the floating gate of the selected memory cell to charge the floating gate. Because approximately 75% of the voltage on the capacitor plate line 26 is coupled to the unselected memory cells, the unselected memory cells are not affected.

It should be noted the state placed into the memory cell by a STORE operation is inverted when RECALLed. For example, a logic "1" state results in uncharged floating gate or $C_{HIGH}$. When a RECALL operation is performed, $C_{HIGH}$ causes the sense amplifier 30 to latch into a logic "0" state. Thus a RECALL after a STORE operation results in an inverted state, which must be inverted once more to obtain the correct result.

One point about the STORE operation is that since the charging and discharging of electrons to and from the floating gate occurs by the tunneling of electrons through a thin oxide layer, the number of times the STORE operation may be repeated is limited to $10^4$ times. The STORE operation is different from the dynamic RAM WRITE operation, which can be repeated an indefinite number of times.

Table 1 below summarizes the operating states of the nonvolatile dynamic RAM.

|  | LOGIC STATE | MEMORY CELL |
|---|---|---|
| Volatile Mode | 1 | +5V |
|  | 0 | 0V |
| Nonvolatile Mode | 0 | $C_{HIGH}$ (floating gate uncharged) |
|  | 1 | $C_{LOW}$ (floating gate charged) |

While the memory circuit was described above in an assymmetric manner for illustrative purposes, as shown in FIG. 3, it is advantageous to have the circuit symmetric with memory cells also attached to the bit line 31 with corresponding decoder and pump circuits. The bit line 21 should also contain a reference cell similar to the cell 32 for the READ and RECALL operations for the memory cells attached to the bit line 31.

Figure 4:
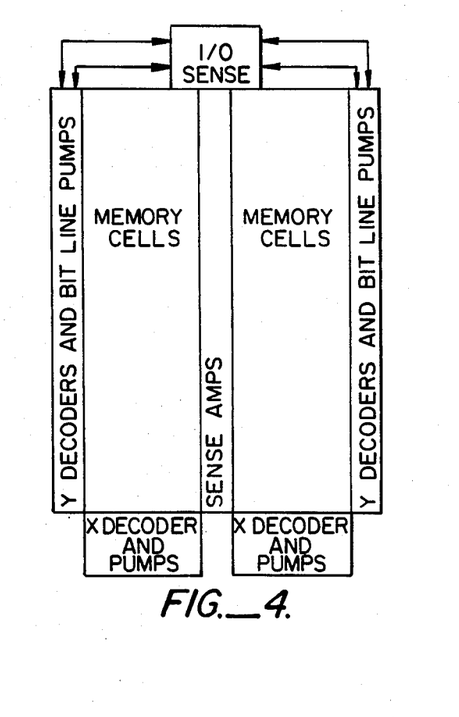
FIG. 4 is an architectural layout of a nonvolatile dynamic RAM using the memory circuit and memory cell of the present invention.

FIG. 4 illustrates the architecture for a 32K bit nonvolatile dynamic RAM using a symmetric configuration discussed immediately above. This nonvolatile dynamic RAM is divided into two halves of memory cells. Each half contains 64 columns by 256 rows of memory cells. The halves are separated by a column of 256 sense amplifiers. The Y address decoders are placed on the outside of each half and the X decoders are placed at the bottom of each half. With the Y decoders and X decoders are the pump circuits for the nonvolatile STORE and RECALL operations.

Figure 5:
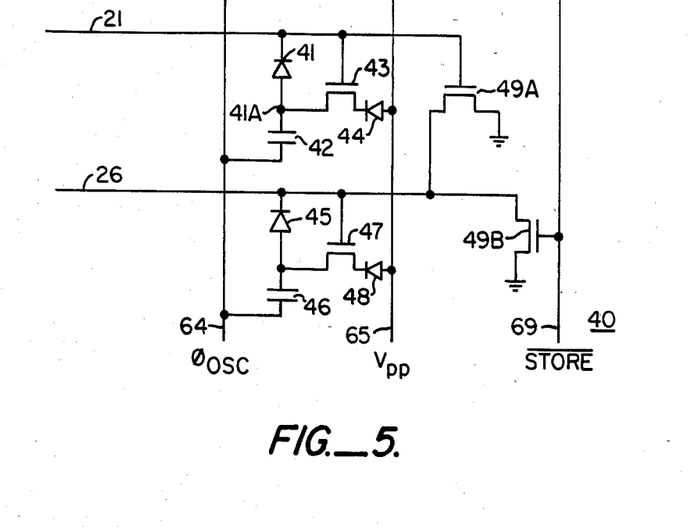
FIG. 5 is a schematic diagram of the bit line and capacitor plate pump circuit shown in FIG. 3.

FIG. 5 is a detailed schematic of the pump circuit 40 for each row of memory cells, as shown in FIG. 3. The pump circuit 40 is connected to a line 64 which has a $\phi_{OSC}$ signal, which is a train of pulses alternating between 0 and +5 volts. Another line 65 is connected to a voltage source $V_{PP}$ at approximately +20 volts. The pump circuit 40 avoids connecting the source $V_{PP}$ directly to the bit line 21 or the capacitor plate line 26. The $V_{PP}$ voltage itself is generated internally in the semiconductor integrated circuit from a single external power source at +5 volts, commonly called $V_{CC}$, by techniques common to EEPROMS. A direct connection requires more current than a $V_{PP}$ generation circuit could handle. This direct connection problem is multiplied since the line 65 is connected to a plurality of rows of bit and capacitor plate lines in the nonvolatile dynamic RAM described previously. On the other hand, the pump circuit 40 permits the charge (and voltage) on the bit line or capacitor plate line to build up gradually to avoid a heavy current drain on the $V_{PP}$ generation circuit.

The pump circuit 40 boosts the bit line 21 to nearly +20 volts by transferring packets of electrons to the line 65 with each cycle on the line 64. Initially the bit line 21 is at +5 volts, which turns on a transistor 43 connected to the line 65 by a diode 44 and to the bit line 21 by another diode 41. This raises the voltage on a node 41A to the P side of the diode 41 to +4 volts by a rough calculation of $V_{DRAIN} = V_{GATE} - V_{THRESHOLD}$. The reverse-biased diode 41 isolates this voltage from the voltage on the bit line 21. Then the line 64, which had been at 0 volts, rises to +5 volts in response to the $\phi_{OSC}$ signal. The line 64 is coupled to the node 41A through a capacitor 42. As the voltage on the line 64 rises, the voltage on the node 41A rises to 9 volts to maintain the voltage across the capacitor 42.

The diode 41 is now forward-biased and the voltage on the bit line 21 is raised to approximately 8 volts as electrons move to the node 41A from the bit line 21. The gate for the transistor 43 also rises to 8 volts, permitting more electrons to move to the line 65 from the node 41A until the voltage there is roughly 7 volts. In the meantime the $\phi_{OSC}$ signal has returned back to 0 volts. When the $\phi_{OSC}$ signal cycles back to 5 volts, the node 41A is raised to +12 volts and the bit line 21 to 11 volts. This, in turn, increases the gate voltage on the transistor 43 permitting the pumping cycle to continue in response to the $\phi_{OSC}$ signal. More and more electrons are pumped to the line 65 from the bit line 21 until the line 21 is nearly +20 volts.

The pump circuit 40 may similarly raise the voltage on the capacitor plate line 26. When the bit line 21 is being pumped high, the action of a transistor 49A keeps the capacitor plate line 26 grounded. Likewise, any non-STORE operation turns the transistor 49B on by the control signal on the line 69 and the capacitor plate line 26 is held to ground. However, when the capacitor plate line 26 is to be raised to +20 volts, the bit line 21 is held at 0 volts by the amplifier 30 to turn off the transistor 49A. The transistor 49B is also turned off for this STORE operation and the capacitor plate line 26 is allowed to float. Diodes 45 and 48, a capacitor 46, and a transistor 47 operate identically as the previously described diodes 41 and 44, capacitor 42 and transistor 43. Since the capacitor plate line 26 starts at 0 volts, more cycles of the $\phi_{OSC}$ signal is required to pump the line 26 high. Sufficient capacitive coupling exists between the elements in circuit to permit the pumping operation to proceed, albeit slowly at first.

The explanation immediately above illustrates the schematic details and operation of one particular pump circuit which is also used in other parts of the memory circuit, such as in the X decoder and pump circuit block 50 in FIG. 3. Other pump circuits or variations of the pump circuit discussed may be used in the present invention.

Pump circuits are also shown in association with FIGS. 3 and 4. The design of these decoder circuits and their coupling to pump circuits are well known to practitioners in the present field and are therefore not shown.

Accordingly, while the invention has been particularly shown and described with reference to the preferred embodiments, it is understood by those skilled in the art that changes in form and details may be made therein without departing from the spirit of this invention. It is therefore intended that an exclusive right be granted to the invention as limited only by the metes and bounds of the appended claims.

What is claimed is:

1. A memory cell comprising
   a first transistor having a first terminal coupled to an input/output line, a second terminal and a control terminal for coupling said first terminal to said second terminal responsive to control signals,
   a first storage capacitor coupled to said second terminal,
   a second storage capacitor,
   a second transistor, having a floating gate, coupled between said first and second capacitors in such manner that said second storage capacitor is coupled to said first storage capacitor depending upon the presence or absence of charge on said floating gate, and said memory cell storing information with only said first storage capacitor when said floating gate is charged and said memory cell storing information with both said first storage capacitor and said second storage capacitor when said floating gate is discharged.

2. The memory cell as in claim 1 wherein said first storage capacitor, said second storage capacitor and said floating gate transistor are connected in parallel.

3. A memory circuit capable of information storage in two modes comprising a plurality of memory cells, each cell having a storage capacitor formed of a fixed capacitance structure and a variable capacitance structure, said storage capacitor having a floating gate to vary the capacitance of said storage capacitor by isolating the variable capacitance structure from the fixed capacitance structure so as to operate in a low capacitor state or by coupling the variable capacitance structure with the fixed capacitance structure so as to operate in a high capacitor state and a transistor for selectively coupling said storage capacitor to a sense line responsive to a selection signal, said floating gate being charged to define the low capacitor state and being uncharged to define the high capacitor state, said floating layer having a double level construction so that it is closer in proximity to a first region than to a second region, and a sense amplifier connected to said sense line for determining the presence or absence of stored charges in said low capacitor state in a first mode, and for determining the presence or absence of stored charges in said high capacitor state in a second mode.

4. The memory circuit as in claim 3 wherein said sense line is discharged before a selected memory cell is coupled to said sense line for said sense amplifier to perform said determining operation in said first mode and wherein said selected memory cell is coupled to said sense line as said sense line is discharged for said sense amplifier to perform said determining operation in said second mode.

5. The memory circuit as in claim 4 wherein each determining operation in said first and second modes is performed by a charge race between a discharged first sense line and related memory cell and a discharged second sense line and a reference memory cell, said sense amplifier going into a state indicative of the results of the charge race.

6. The memory circuit as in claim 5 wherein said reference memory cell comprises a first and second reference capacitors, and a first and second transistors, each transistor associated with one of said reference capacitors for selectively coupling said associated reference capacitor to said second sense line responsive to a mode selection signal, whereby, for a determining operation in said first mode, said first reference capacitor is selected for said charge race and, for a determining operation in said second mode, said second reference capacitor is selected for said charge race.

7. The memory circuit as in claim 6 wherein said first reference capacitor and said second sense line have a capacitance less than the capacitance of said selected memory cell and said first sense line.

8. The memory circuit as in claim 7 wherein the capacitance of said second reference capacitor and said second sense line is intermediate that of the capacitance of said selected memory cell having a floating gate charged and said first sense line, and the capacitance of said selected memory cell, having a floating gate uncharged and said first sense line.

9. The memory circuit as in claim 3 further comprising means coupled to said plurality of memory cells for charging and discharging the floating gate of a selected memory cell.

10. The memory circuit in claim 9 wherein each of said memory cells comprises first and second regions disposed in a spaced-apart relationship in a semiconductor substrate, a capacitor plate layer disposed over said substrate and above said first and second regions, a floating gate disposed between said first and second regions and intermediate said capacitor plate layer and said substrate, said floating gate layer being electrically isolated from said first and second regions and said capacitor plate layer, and said floating gate charging and discharging means operates by increasing a voltage difference between said capacitor plate layer and one of said first and second regions such that charges can move therebetween.

11. The memory circuit as in claim 3 wherein said sense line is discharged before a selected memory cell is coupled to said sense line for said sense amplifier to perform said determining operation in said first mode and wherein said selected memory cell is coupled to said sense line as said sense line is discharged for said sense amplifier to perform said determining operation in said second mode.

12. The memory circuit as in claim 11 wherein each determining operation in said first and second modes is performed by a charge race between a discharged first sense line and related memory cell and a discharged second sense line and a reference memory cell, said sense amplifier going into a state indicative of the results of the charge race.

13. A memory cell comprising:

a storage capacitor having a fixed capacitance structure and a variable capacitance structure;

said storage capacitor being formed of first and second regions disposed in a spaced-apart relationship in a semiconductor substrate, a plate layer disposed over said substrate and above said first and second regions, and a floating gate layer disposed between said first and second regions and intermediate said plate layer and said substrate, said floating gate layer being electrically isolated from said first and second regions and said plate layers;

said floating gate layer varying the capacitance of said storage capacitor by isolating the variable capacitance structure from the fixed capacitance structure so as to operate in a low capacitance state or by coupling the variable capacitance structure with the fixed capacitance structure so as to operate in a high capacitance state, said floating gate being charged to define the low capacitance state and being uncharged to define the high capacitance state;

said floating layer having a double level construction as that it is closer in proximity to said first region than to said second region;

a transistor having a first terminal coupled to said storage capacitor, a second terminal coupled to an input/output line, and a control terminal for coupling said storage capacitor through said input/output line responsive to control signals; and said transistor being formed of third and fourth regions disposed in a spaced-apart relationship in said semiconductor substrate and a transfer gate layer disposed over said substrate and between said third and forth regions, said transfer gate layer being electrically isolated from said third and fourth regions.

14. A memory cell as in claim 13 wherein said semiconductor substrate is of one conductivity type and said first, second, third and fourth regions are of another conductivity type.

15. A memory cell as in claim 14 wherein said floating gate layer, said plate layer and said transfer gate layer comprise polysilicon.

16. A memory cell as in claim 15 wherein said third region is coupled to said input/output line and said fourth is coupled to first region.

17. A memory cell as in claim 16 wherein said fourth and first regions are contiguous.

* * * * *